United States Patent
Cole et al.

Patent Number: 6,153,834
Date of Patent: Nov. 28, 2000

[54] FLEXIBLE CIRCUIT WITH TABS FOR CONNECTION TO BATTERY CELLS

[75] Inventors: Joseph Daren Cole, Auburn; Amy T. Deslyper, Dacula; Jose' A. Mendez, Suwanee; Stephen N. Carr, Loganville; Thomas H. Mata, Altanta, all of Ga.

[73] Assignee: Motorola, Inc., Schaumburg, Ill.

[21] Appl. No.: 09/054,096

[22] Filed: Apr. 2, 1998

[51] Int. Cl.[7] ............................ H01M 2/22
[52] U.S. Cl. .................. 174/260; 174/254; 361/749; 361/782; 429/100
[58] Field of Search ............... 174/254, 260; 361/749, 782, 811, 750, 751; 439/67, 77, 500; 429/96, 99, 100, 123, 127

[56] References Cited

U.S. PATENT DOCUMENTS

| | | | |
|---|---|---|---|
| 4,371,593 | 2/1983 | Ramey | 429/123 |
| 4,587,719 | 5/1986 | Barth | 361/749 |
| 4,922,059 | 5/1990 | Walker et al. | 361/749 |
| 5,008,496 | 4/1991 | Schmidt et al. | 174/254 |
| 5,104,754 | 4/1992 | Dorinski et al. | 429/99 |
| 5,240,787 | 8/1993 | Goldschmidt et al. | 429/100 |
| 5,296,831 | 3/1994 | Suzuki | 174/254 |
| 5,472,804 | 12/1995 | Austin et al. | 429/99 |
| 5,506,488 | 4/1996 | Leiserson | 429/100 |
| 5,833,491 | 11/1998 | Suzuki | 439/500 |
| 5,861,667 | 1/1999 | Kuwano | 257/691 |
| 5,914,853 | 6/1999 | Motoe et al. | 361/680 |
| 5,993,248 | 11/1999 | Bethurum | 439/500 |

FOREIGN PATENT DOCUMENTS

| | | | |
|---|---|---|---|
| 4-263495 | 9/1992 | Japan | 361/749 |
| WO90/13989 | 11/1990 | WIPO | 361/749 |

*Primary Examiner*—Jeffrey Gaffin
*Assistant Examiner*—John B. Vigushin
*Attorney, Agent, or Firm*—Philip H. Burrus, IV

[57] ABSTRACT

Described is a flexible circuit for a battery cell where the tabs of the flexible circuit have two or more perpendicular axis of bending. The multiple axes of bending allow the flexible circuit to be placed atop a battery cell, and both tabs of the flexible circuit can then be pinch (series) welded to the tabs of the battery cell. This results in a strong, predictable weld, and a more durable, reliable, electronic product.

1 Claim, 5 Drawing Sheets

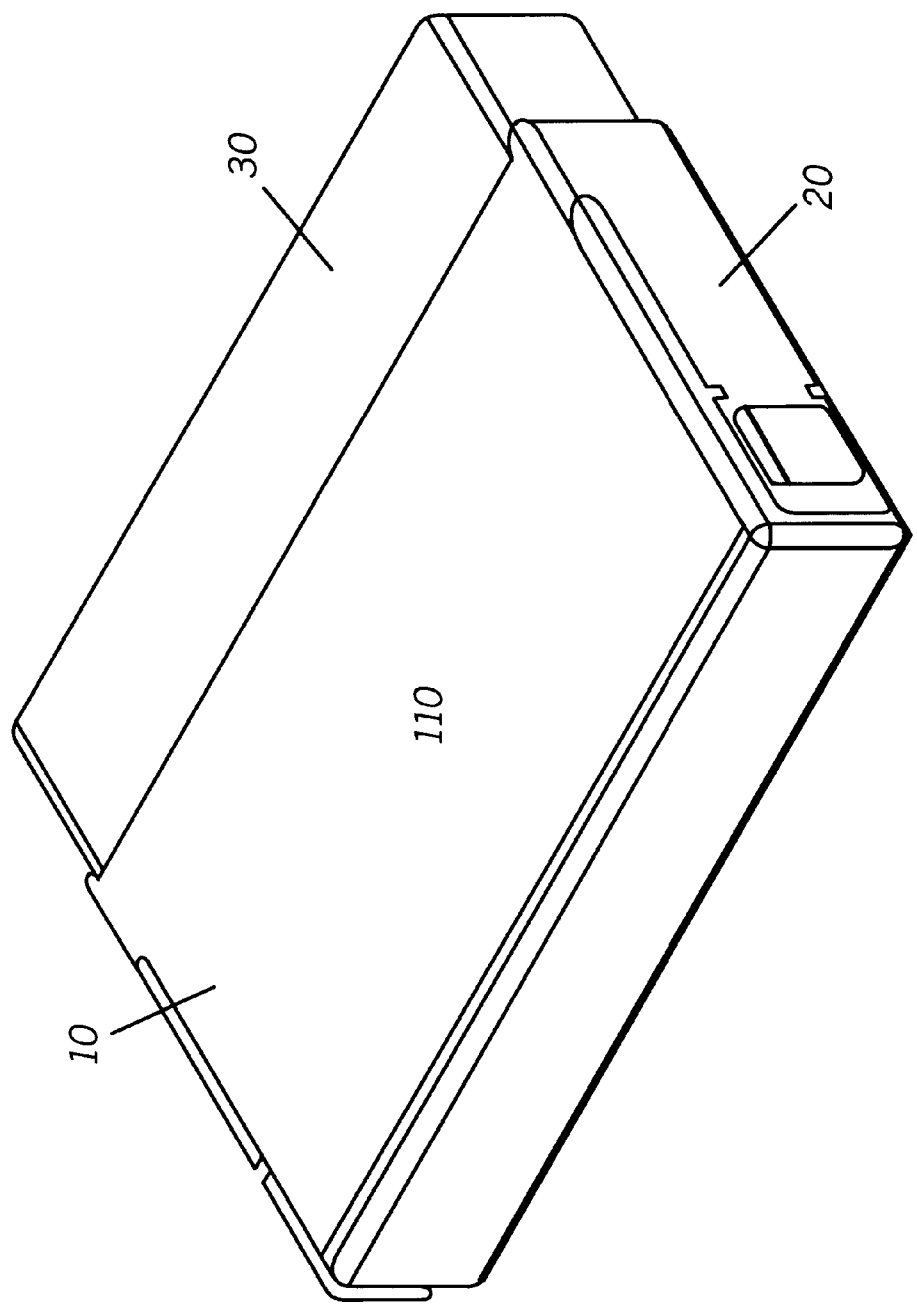

FLEXIBLE CIRCUIT WITH TABS FOR CONNECTION TO BATTERY CELLS

TECHNICAL FIELD

This invention relates in general to flexible printed circuits, more specifically in the field of flexible printed circuits for battery cells.

BACKGROUND

Nearly forty million American now use a cellular telephone and another seven million or so are expected to subscribe the coming year. Sales of cellular phones have risen faster than those of facsimile machines, subscriptions to cable televisions, and sales of videocassette recorders. Cellular telephones have become a feature of the mark in business and recreational landscape. Customers have come to expect, and demand, steady increases in reliability and portability of the telephones. They have also come to demand the constant reductions in cost of the telephones.

A critical aspect of the reliability of the cellular telephone is the reliability of its power source, the battery. The battery may well be the single most important feature in a cellular telephone, or for that matter, a two-way radio. Consumer surveys have shown that talk time is the feature valued by users of cellular telephones and two-way radios above all else. Therefore, there is a need for a battery for a cellular telephone or two-way radio of improved durability and reliability.

BRIEF DESCRIPTION OF THE DRAWINGS

FIG. 5 shows the flexible printed circuit of the present invention as it would be placed on the battery cell in a line with the tabs of the battery cell.

DETAILED DESCRIPTION OF THE PREFERRED EMBODIMENTS

The present invention is a flexible circuit whose tabs have two perpendicular axes of bending. When the flexible circuit lies flat in a plane parallel to the xy plane in three-dimensional space, the flexible circuit tabs have an axis of bending parallel to the y axis, and another axis of bending parallel to the x axis. This permits the flexible circuit to be placed on a typical rectangular or flat battery cell, and the tabs of the flexible circuit to be aligned with the tabs on the side of the battery cell, then the tabs to be series, or pinch, welded together.

As cellular phone use has become ubiquitous, users of cellular phones have come to demand ever greater talk time and an ever increasing number of features such as facsimile capabilities and paging. All these features require power. This power is now typically provided by advanced chemistries, such as lithium-ion batteries, which require circuitry for safe and effective charging and discharging. The means for attaching the circuitry, typically flexible printed circuits, to the battery cell has been by welding the flexible circuit tab to the battery cell tab.

Figure 2:
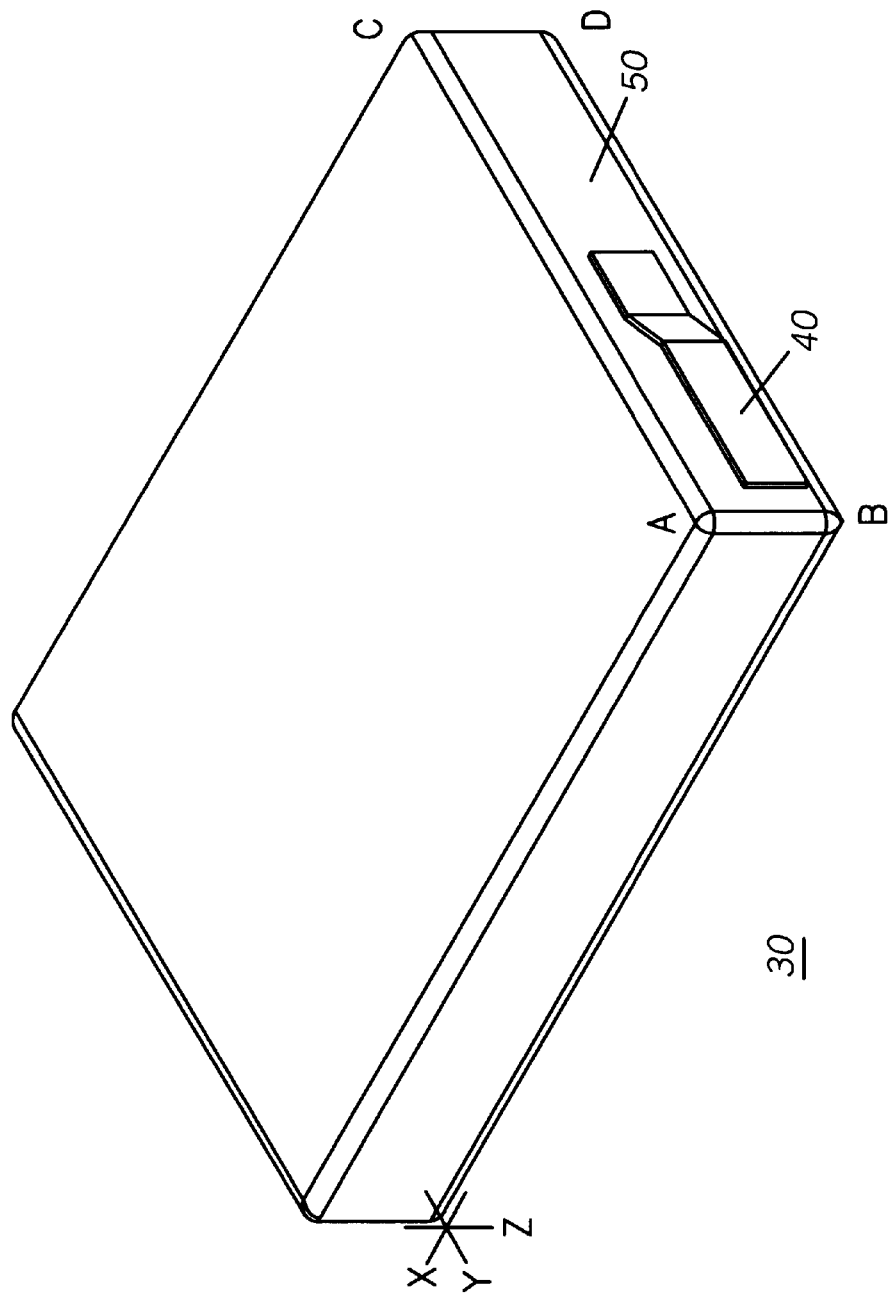
FIG. 2 is a perspective view of a typical battery cell, showing a typical metal tab extending from the side of the cell. The battery cell is shown along the xyz coordinate axis.
Figure 3:
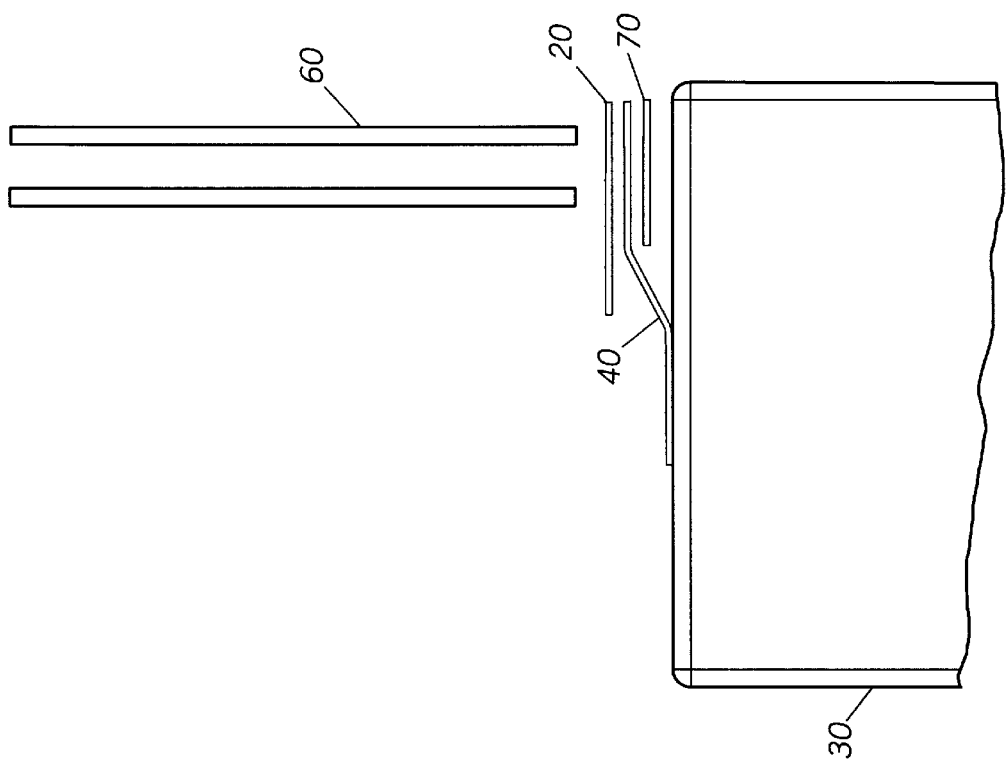
FIG. 3 is a view of two electrodes about to parallel weld a flexible circuit tab to a battery cell tab, with the coin underneath the tabs between the tabs and the battery cells.

FIG. 2 shows a typical rectangular battery cell (30) in xyz space. Side (50) of the battery cell (30) has flat metal tab (40) secured to it. FIG. 3 shows a typical parallel welding process. Flexible circuit tab (20) lies above battery cell tab (40), and beneath those tabs is placed a coin (70). Below the foregoing lies a battery cell (30). Parallel electrodes (60) press down on the two tabs until they touch each other and electrically contact coins (70). Electrodes (60) of the welding apparatus (not shown), are then activated, and current flows, hopefully, through one electrode, through flexible circuit tab (20), through battery cell tab (40), through coin (70), back through battery cell tab (40), back through flexible circuit tab (20) and back through the other electrode in a big "U". However, the path the electricity takes may also be simply from electrode (60) through flexible circuit tab (20) back through the other electrode (60). This path would clearly not result in a strong weld between flexible circuit tab (20) and battery cell tab (40).

Figure 4:
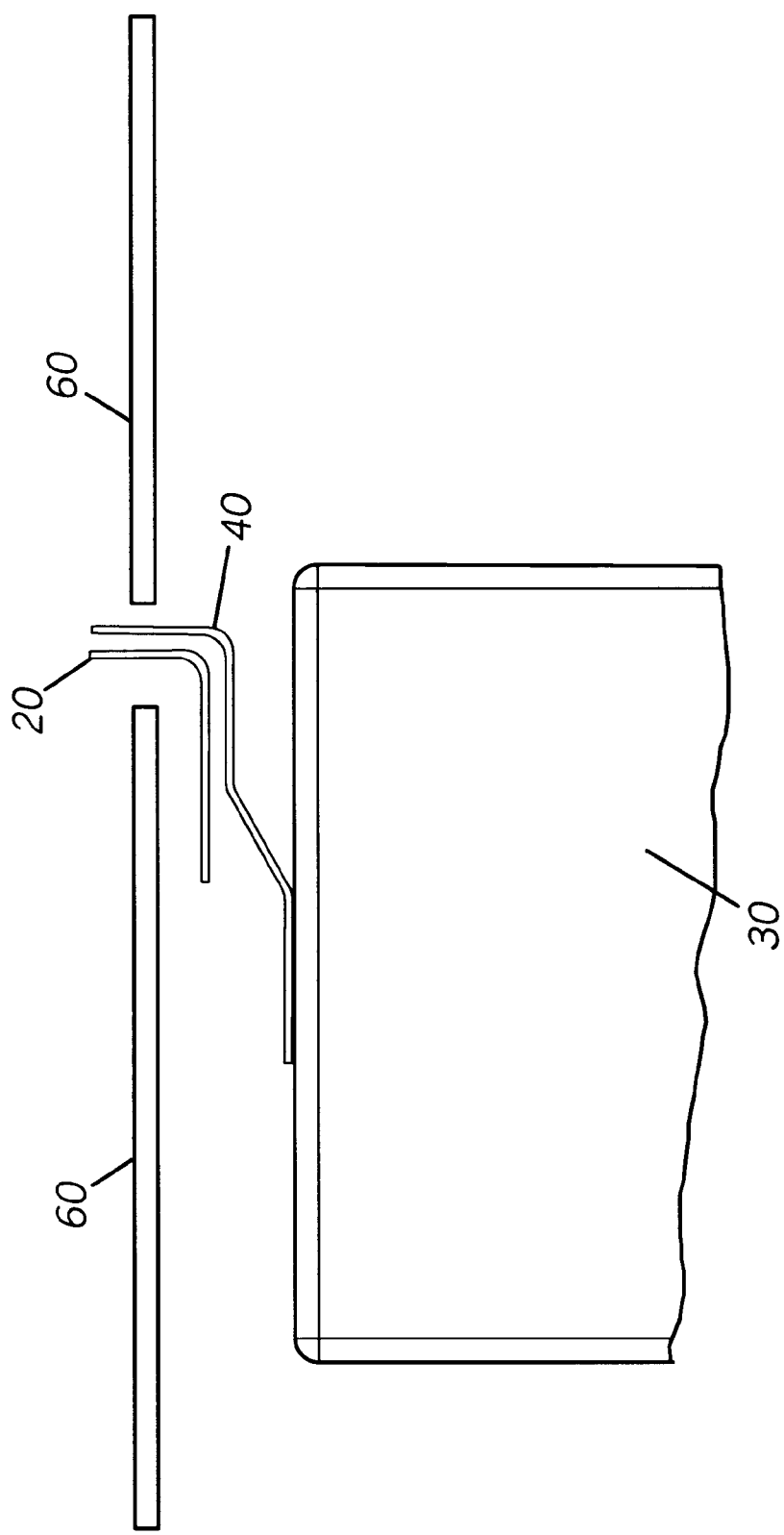
FIG. 4 shows two electrodes about to pinch or series weld a flexible circuit tab to a battery cell tab.

FIG. 4 shows series, or pinch, welding. Flexible circuit tab (20) and battery cell tab (40) are aligned, both curving outward from battery cell (30). Electrodes (60) are pushed together in the direction of the arrows, and are activated. Current flows from one electrode (60) through battery cell tab (40) through flexible circuit tab (20) back through the second electrode (60), welding the two tabs together. The path of the current flow is known, and this method of welding is a predictable, reliable method. However, since the tabs of the prior art flexible circuits are short and inflexible, once one flexible circuit tab is welded to a battery tab, only parallel welding can be done with the other flexible circuit tab. The present invention solves this dilemma.

Figure 1:
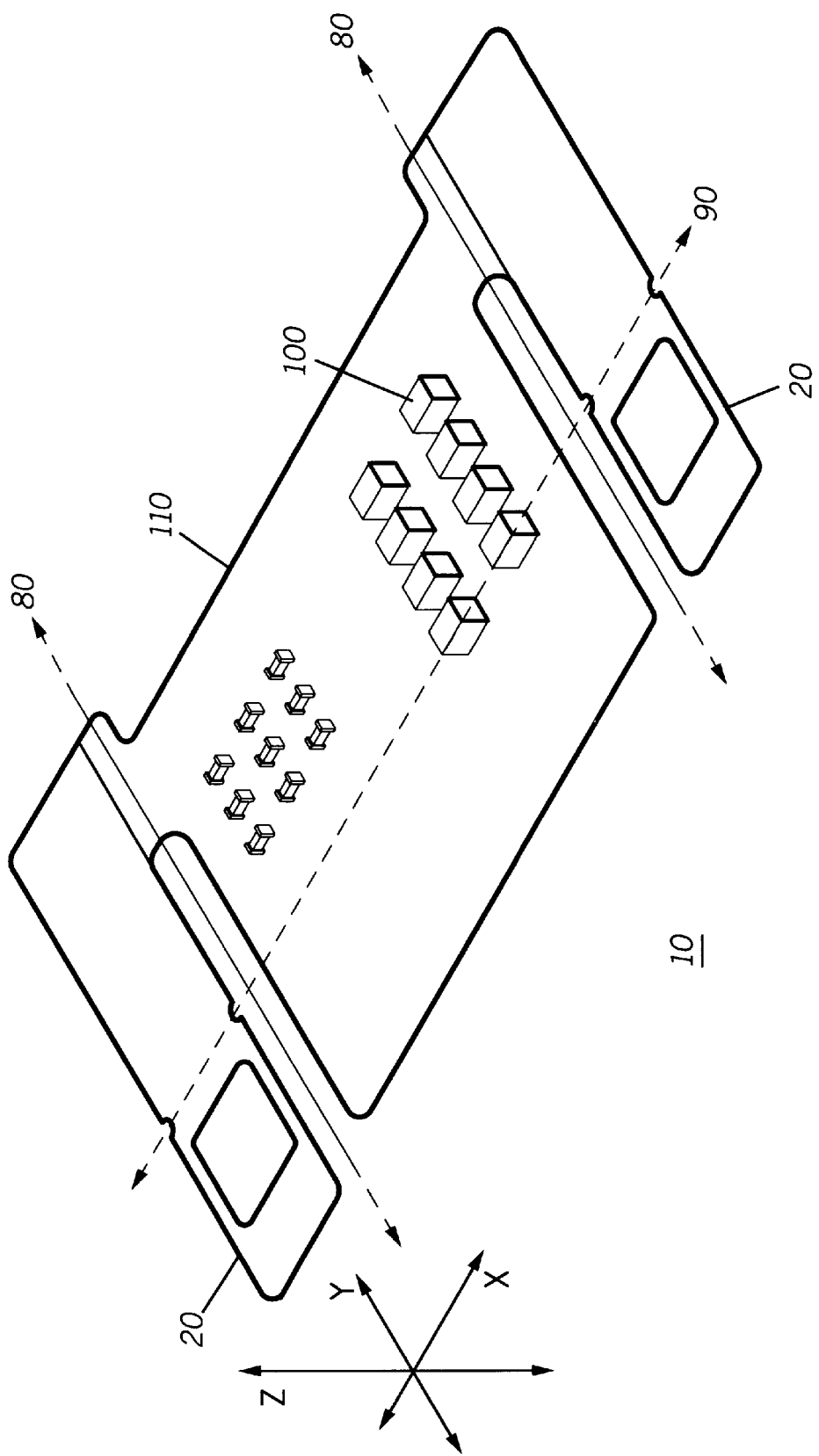
FIG. 1 is a perspective view of the flexible printed circuit for a battery cell of the present invention. The flexible circuit is shown as lying flat in the xy plane.

FIG. 1 shows the flexible circuit of the present invention. The flexible circuit (10) is shown as lying flat in the xy plane in three-dimensional space. The flexible circuit (10) includes tabs (20) on either side of the flexible circuit, and components (100) printed on the flexible circuit. The flexible circuit may be made of, for instance, copper traces sandwiched between two layers of Mylar™. Tab (20) can bend along axis (80) parallel to the y axis, and along axis (90) parallel to the x axis. When the flexible circuit tab (20) is bent normally, the plane in which the tab circuit tab lies intersects the plane in which the main part (110) of the flexible circuit lies. The two planes intersect along axis (80). Each flexible circuit tab (20) also has a free axis of bending (90), which is perpendicular to axis (80). These axes of bending (80 and 90) intersect at a right angle in space. The axes (80 and 90) do not intersect within the flexible circuit tab (20). The flexible circuit comprises a tab with two or more axes of bending.

This invention thus allows flexible printed circuit (10) to be placed on a battery cell (30) as shown in FIG. 5. The tabs (40) along sides (50) of the battery cell can be bent outward, and the twin axes of bending (80 and 90) of the flexible circuit tabs (20) allow the flexible circuit tabs to be bent to lie along the battery cell tabs (40). The battery cell tabs, (40) can now be pinch welded to circuit tabs (20). Therefore, pinch or series welding can be performed between the battery cell tabs (40) and the flexible circuit tabs (20), resulting in higher strength welds, and thus less defective product. This reduces production costs, and increases customer satisfaction. In the present invention, tabs (20) may be somewhat longer than those in the prior art, in order to accommodate two perpendicular axis of bending (80 and 90).

In one embodiment of the invention, the flexible circuit has tabs with two perpendicular axis of rotation. However, in another embodiment of the invention, the tabs for the flexible circuit could have three or more perpendicular axis of rotation. The number of axis of rotation needed would be dependent on the position of the tabs of the battery cells.

The flexible circuit of the present invention may be employed with any electronic device requiring a secure connection between flexible circuit tabs and battery cell tabs.

The present invention may be better understood from the following example.

EXAMPLE

A flexible circuit for a battery for a cellular telephone was made in accordance with the present invention. The circuit was on a strip of Mylar™ approximately 46 mm by 18 mm. The tabs at the end of their rectangular strip of Mylar™ measured 23 mm by 8 mm. The tabs of the circuit easily aligned with the tabs of a lithium-ion cell for a cellular telephone. The cell measured 46 mm by 33 mm by 8 mm. Tabs on the cell were somewhat elongated and it is clear that the tabs of the cell could easily both be pinch welded to the tabs of the flexible circuit.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A battery comprising tabs electrically connected to a flexible circuit comprising a tab with two or more axes of bending, wherein the electrical connection is a weld.

* * * * *